US008809112B2

(12) United States Patent
Stockum et al.

(10) Patent No.: US 8,809,112 B2
(45) Date of Patent: Aug. 19, 2014

(54) SELECTIVELY ETCHING OF A CARBON NANO TUBES (CNT) POLYMER MATRIX ON A PLASTIC SUBSTRUCTURE

(75) Inventors: Werner Stockum, Reinheim (DE); Arjan Meijer, Darmstadt (DE); Ingo Koehler, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 14 days.

(21) Appl. No.: 13/699,092

(22) PCT Filed: Apr. 26, 2011

(86) PCT No.: PCT/EP2011/002085
§ 371 (c)(1),
(2), (4) Date: Nov. 20, 2012

(87) PCT Pub. No.: WO2011/144292
PCT Pub. Date: Nov. 24, 2011

(65) Prior Publication Data
US 2013/0065359 A1     Mar. 14, 2013

(30) Foreign Application Priority Data
May 21, 2010   (EP) .................................... 10005321

(51) Int. Cl.
*H01L 51/40*   (2006.01)
*H01L 21/302*   (2006.01)
(52) U.S. Cl.
USPC ............................................ 438/99; 438/738
(58) Field of Classification Search
USPC .................................... 438/99, 738
See application file for complete search history.

(56) References Cited

U.S. PATENT DOCUMENTS

| 5,424,054 | A | 6/1995 | Bethune et al. |
| 6,221,330 | B1 | 4/2001 | Moy et al. |
| 6,835,591 | B2 | 12/2004 | Rueckes et al. |
| 8,211,320 | B2 * | 7/2012 | Pei .................................. 216/11 |
| 2002/0025374 | A1 | 2/2002 | Lee et al. |
| 2005/0247674 | A1 | 11/2005 | Kubelbeck et al. |
| 2009/0278112 | A1 | 11/2009 | Schricker et al. |
| 2010/0075024 | A1 * | 3/2010 | Ajayan et al. .................. 427/66 |

FOREIGN PATENT DOCUMENTS

| JP | 2005 327965 | 11/2005 |
| WO | WO-2008 051205 | 5/2008 |
| WO | WO-2009 126891 | 10/2009 |

OTHER PUBLICATIONS

International Search Report for PCT/EP2011/002085, Date of the actual completion of the international search: Dec. 8, 2011, Date of mailing of the international search report: Dec. 15, 2011.
Kymakis, E. et al., "Carbon nanotubes as electron acceptors in polymeric photovoltaics," Rev. Adv. Mater. Sci., 2005, vol. 10, pp. 300-305.
Kymakis, E. et al., "Photovoltaic cells based on dye-sensitisation of single-wall carbon nanotubes in a polymer matrix," Solar Energy Materials & Solar Cells, 2003, vol. 80, pp. 465-472.

(Continued)

*Primary Examiner* — Lex Malsawma
(74) *Attorney, Agent, or Firm* — Millen, White, Zelano & Branigan, P.C.

(57) ABSTRACT

The present invention refers to a method for selectively structuring of a polymer matrix comprising CNT (carbon nano tubes) on a flexible plastic substructure. The method also includes a suitable etching composition, which allows to proceed the method in a mass production.

15 Claims, 1 Drawing Sheet

(56) References Cited

OTHER PUBLICATIONS

Landi, B. J. et al., "CdSe quantum dot-single wall carbon nanotube complexes for polymeric solar cells," Solar Energy Materials & Solar Cells, 2005, vol. 87, pp. 733-746.

Landi, B. J. et al., "Single-wall carbon nanotube-polymer solar cells," Progress in Photovoltaics: Research and Applications, 2005, vol. 13, pp. 165-172.

Pradhan, B. et al., "Carbon nanotube—Polymer Nanocomposite Infrared Sensor," Nano Letters, 2008, vol. 8, No. 4, pp. 1142-1146.

Rowell, M. W. et al., "Organic solar cells with carbon nanotube network electrodes," Applied Physics Letters, 2006, vol. 88, pp. 233506-1-233506-3.

Saito, R., Physical Properties of Carbon Nanotubes, 1998.

Shachihata Inc., "Photovoltaic device," Patent Abstracts of Japan, Publication Date: Nov. 24, 2005; English Abstract of JP-2005 327965.

\* cited by examiner

SELECTIVELY ETCHING OF A CARBON NANO TUBES (CNT) POLYMER MATRIX ON A PLASTIC SUBSTRUCTURE

TECHNICAL FIELD

The present invention refers to a method for selectively structuring of a polymer matrix comprising CNT (carbon nano tubes) on a flexible plastic substructure. The method also includes a suitable etching composition, which allows to proceed the method in a mass production.

BACKGROUND OF THE DISCLOSURE

The solar power market has continuously grown in popularity and the ability to create high-efficiency solar cells is a key strategy to meet the growing world energy needs. Today's photovoltaic systems are predominantly based on the use of crystalline silicon, thin-film and concentrator photovoltaic technologies.

Thin-film technologies have lower efficiencies than crystalline silicon cells but permit direct application to a surface that can be plastic. Thin-film technology reduces end product costs because it allows for smaller amounts of semiconductor material to be used, can be manufactured by a continuous process, and results in a product that is less likely to be damaged during transportation.

Thus, a promising low cost alternative to silicon solar cells can be found in organic photovoltaic devices (OPVs), if their power conversion efficiency can be increased comparable to common devices (Landi, B. J.; Raffaelle, R. P.; Castro, S. L.; Bailey, S. G., (2005). "Single-wall carbon nanotube-polymer solar cells". *Progress in Photovoltaics: Research and Applications* 13 (2): 165-172) and if moderate power conversion efficiencies can be achieved at low costs.

Organic (polymer-based) solar cells are flexible, and according to the current state of development, their production costs are about a third of the price of silicon cells. They are disposable and can be designed on a molecular level. Current research is focusing on the improvement in efficiency and development of high-quality protective coatings to minimize the environmental effects.

Such organic photovoltaic devices (OPVs) may be fabricated from thin films of organic semiconductors, such as polymers and small-molecule compounds, and are typically on the order of 100 nm thick. Since polymer based OPVs can be made using a coating process such as spin coating or inkjet printing, they are an attractive option for inexpensively covering large areas as well as flexible plastic surfaces. This means, OPVs based on conjugated polymers can be fabricated by highly scaleable, high speed coating and printing processes enabling rapid mass-production. OPVs' low cost and manufacturing ease make them attractive even if their efficiencies are lower than that of existing technologies. Subsequently there is a large amount of research being dedicated throughout industry and academia towards developing new OPVs.

Nanotechnology is currently enabling the production of organic photovoltaics (OPVs) to overcome the disadvantages associated with traditional silicon based photovoltaics. Organic photovoltaics are composed of layers of semiconducting organic materials (polymers or oligomers) that absorb photons from the solar spectrum. In OPVs, solar radiation promotes the photoactive semiconducting organic materials in the photoactive layer to an excited state. This excited state is referred to as an exciton and is a loosely bounded electron-hole pairing.

This was made possible by the discovery of photoinduced electron transfer from the excited state of a conjugated polymer (as the donor) onto fullerene (as the acceptor). Fullerene provides higher electron separation and collection efficiency compared to previously known electron acceptors.

Photovoltaic cells based on polymer/fullerene $C_{60}$ planar heterojunctions have been reported earlier. Blending a conjugated polymer and $C_{60}$ (or its functionalized derivatives) results in moderate charge separation and collection efficiencies due to the formation of bulk donor-acceptor (D-A) heterojunctions.

In this context carbon nanotubes (CNTs) have also attracted great interest with their nano-scale cylindrical structure. Carbon nanotubes (CNT) layers seem very promising and applications of CNTs in OPVs are of much interest. Depending on the varied chiralities (the arrangement of the carbon honeycomb with respect to its axis), CNTs can be semiconducting or metallic with nearly ballistic conduction. CNTs, especially single wall carbon nanotubes (SWCNTs), are known as excellent electron transporters. SWCNTs have in fact already been employed as electrodes and blended with conjugated polymers to form bulk heterojunctions in the active layers. Kymakis et al. first reported a photovoltaic device based on the blend of SWCNTs and the conjugated polymer poly(3-octylthiophene) (P3OT) [E. Kymakis; G. A. J. Amaratunga, Solar Energy Materials and Solar cells 80, 465-472 (2003), "Photovoltaic Cells Based on Dye-Sensitization of Singel-Wall Carbon Nanotubes in a Polymer Matrix"]. Adding SWCNTs to the P3OT matrix improved the photocurrent by more than two orders of magnitude. In a another work, Pradhan et al. blended functionalized multi-walled carbon nanotubes (MWCNTs) into a poly(3-hexylthiophene) polymer (P3HT) to provide extra dissociation sites and assist in charge transport in a P3HT-MWCNT/$C_{60}$ double-layered device [B. Pradhan, Ksetyowati, H. Liu, D. H. Waldeck, J. Chen, Nano Letters 8 (4), 1142-1146 (2008)].

However, nanotubes distributed within a polymer matrix are less efficient in separating photogenerated carriers than spherical $C_{60}$ molecules that have a larger surface to volume ratio and it is difficult to disperse CNTs in a photoactive matrix.

CNT layers have a transparency in the visible and IR spectrum and because of their electrical properties CNT coatings and circuits are becoming one of the latest alternatives to traditional conductive materials [e.g. indium tin oxide (ITO), fluorine-doped tin oxide (FTO), zinc oxide or cadmium sulfide] [R. Saito, G Dresselhaus, M. S. Dresselhaus, "Physical Properties of Carbon Nanotubes", Imperial College Press, London U.K. 1998]. Carbon nanotubes are an allotrope of carbon that is found in both a single-walled carbon nanotube and multi walled carbon nanotube variety. Carbon nanotubes are known to exhibit extraordinary strength, heat conductance, and electrical properties.

Known CNT networks are p-type conductors, whereas traditional transparent conductors are exclusively n-type. The availability of a p-type transparent conductor could lead to new cell designs that simplify manufacturing and improve efficiency: They are easier and cheaper than ITO to deposit on glass and plastic surfaces, since they can be formed into a solution, compared with ITO which has to be sputtered onto a surface in a vacuum. This is why it is desirable to apply CNT layers and to replace ITO layers in photovoltaic devices.

Combination of CNTs with electron donors signifies an important concept to harvest solar energy and convert it into electricity. Like $C_{60}$, CNTs have been introduced into the same conjugated polymers to produce organic photovoltaic devices [E. Kymakis, G. A. J. Aramatunga, Rev. Adv. Mater. Sci. 10, 300-305 (2005)].

Most importantly, CNT-based hetero junctions are of particular interest because of their unique geometry as well as excellent electronic, thermal and mechanical properties. Free electron/hole pairs excited by photons can be either separated by an externally applied voltage, by internal fields at the Schottky barriers, at p-n junctions or at defects. A photocurrent or a photo voltage can be generated.

The photo current in CNT junctions shows band-to-band transitions and photon-assisted tunneling with multiple sharp peaks in the infrared, visible and ultraviolet. Besides individual CNT, CNT macro-bundles and films also produce a photocurrent. Windows/back electrode made from CNTs is yet another important application in solar cells. Thin, transparent layers comprising bulk metallic CNTs have been proposed for providing lateral (in-plane) electrical conductivity for collecting current from the front surface of thin-film solar cells.

At present further developments of OVPs comprising CNTs is intensified in order to make them ready for the market.

JP 2005327965 (A) discloses a photovoltaic device using carbon nanotubes, especially multilayered carbon nanotubes, wherein carbon nanotubes are dispersed in a medium, which is laminated on a conductive substance. The latter may be an aluminium or a copper foil. The surface of the CNT comprising layer is brought into contact with a collector or an electrode. A transparent protective layer, which may consist of silicone rubber or plastics, is further laminated on the carbon nanotubes comprising layer or on the conductor obtained by dispersing the carbon nanotubes in a medium.

Different methods of forming layers comprising carbon nanotubes are known. For example CNTs are deposited from the gaseous carbon feedstocks in the presence of unsupported catalysts (see U.S. Pat. No. 6,221,330) or carbon vapour is produced by electric arc heating of solid carbon and contacting the carbon vapour with cobalt catalyst (U.S. Pat. No. 5,424,054).

US 2002/0025374 A1 discloses a selective growth method on a substrate to form patterned carbon nanotubes. The nanotubes are grown directly on a surface at high temperatures >500° C. This limits this technology to substrates withstanding high temperatures.

In U.S. Pat. No. 6,835,591 a conductive article is disclosed, which includes an aggregate of nanotube segments in which the nanotube segments contact other nanotube segments to define a plurality of conductive pathways along the article. The articles so formed may be disposed on substrates, and may form an electrical network of nanotubes within the article itself. Conductive articles may be made on a substrate by forming a nanotube fabric on the substrate, and defining a pattern within the fabric in which the pattern corresponds to the conductive article. The nanotube fabric may be formed by depositing a solution of suspended nanotubes on the substrate. The deposited solution may be spun to create a spin-coating of the solution. The solution may be deposited by dipping the substrate into the solution. The nanotube fabric is formed by spraying an aerosol having nanotubes onto a surface of the substrate.

Again in WO2008/051205 A2 CNT layers are formed in a two step method. First a dilute water solution of CNTs is sprayed on a substrate. Water is evaporated leaving only the consolidated carbon nanotubes on the surface. Then a resin is applied on the CNTs and penetrates into the network of the consolidated CNTs. The prepared layer shows a low electrical resistance as well as a high light transmittance. WO2008/051205 A2 also discloses the preparation of a photovoltaic cell, whereby an active layer is formed between a first and a second electrode. The first and the second electrode are transparent conductive coatings containing CNTs. The comprising CNTs may be single walled carbon nanotubes (SWNT) or multi-walled carbon nanotubes (MWNT). The active layer comprises an electron acceptor material and an electron donor material. The acceptor properties as well as the donor properties can be achieved by doping functionalizations or by placing a thin (2-6 nm) alkali fluoride layer between the first electrode and the active layer and between the active layer and the second electrode. The acceptor may be a fullerene component. The electron donor may comprise a conjugated polymer, like poly(3,4-ethylene dioxythiophene, or other polythiophene derivatives, polyaniline or other electron donor polymers. The electrodes may be mesh electrodes, which guarantee flexibility, made of metals, like palladium, platinum, titanium, stainless steel, and alloys thereof.

In all these cases carbon-based films, including but not limited to CNTs, single walled carbon nanotubes (SWNT), multi-walled carbon nanotubes (MWNT) or fullerenes ($C_{60}$) may exhibit active components in transparent layers suitable for transforming solar energy into electricity. However, when CNT material is used to form a part of photovoltaic devices, the comprising CNT material often has a rough surface topography, with pronounced thickness variations, such as numerous peaks and valleys. The rough surface topography can cause difficulties. For example, the rough surface topography of CNT materials can make CNT materials difficult to be etched without undesired etching of the underlying substrate, or without increasing fabrication costs and associated with their use in integrated circuits.

OBJECTIVE

Regardless of whether CNT comprising layers are applied in touch panels, displays (LCD) or photovoltaik devices, like solar cells, these layers have to be patterned precisely in one form or another in order to get uncoated areas as the insulation between the conductive pathways and contacts. Sometimes, if desired, this patterning has to include the CNTs as well as the neighbouring polymers and the polymeric substructure made. Thus, it is an objective of the present invention to provide a cheap and easy workable method for patterning conductive polymer layers comprising CNTs and, if desired, together with the flexible substructure, with high resolution and at high performance but also with high selectivity and leading to etched lines or structures having nearly vertical sidewalls, little or no undercut of the CNT comprising material and having a smooth and even bottom.

A solar cell usually consists of a p-conducting substrate into which a layer of an n-conducting substance is diffused on the front side. A metallically conducting contact is applied to the front and reverse sides for conduction of the current produced on incidence of light. With regard to an inexpensive production process which is suitable for mass production, the contact may be produced by screen printing.

According to the current state of the art, any desired structures can be etched selectively in a polymer based substrate, directly by laser-supported etching methods or after masking by wet-chemical methods or by dry-etching methods.

In laser supported etching methods the laser beam scans the entire etch pattern dot by dot or line by line in the case of vector-orienting systems, on the substrate, which, in addition to a high degree of precision, also requires considerable adjustment effort and is very time-consuming.

BRIEF DESCRIPTION OF THE INVENTION

The wet-chemical and dry etching methods include material-intensive, time-consuming and expensive process steps:

A. masking of the areas not to be etched, for example by photolithography:
   production of a negative or positive of the etch structure (depending on the resist), coating of the substrate surface (for example by spin-coating with a liquid photoresist), drying of the photo-resist, exposure of the coated substrate surface, development, rinsing, if desired drying B. etching of the structures by:
   dip methods (for example wet etching in wet-chemical banks):
   dipping of the substrates into the etch bath, etching process, repeated rinsing in $H_2O$ cascade basins, drying
   spin-on or spray methods:
   the etching solution is applied to a rotating substrate, the etching operation can take place without/with input of energy (for example IR or UV irradiation),
   or known dry-etching methods as there are for example, plasma etching in expensive vacuum units or etching with reactive gases in flow reactors
and
C. In the final process step, the photoresist covering the protecting areas of the substrate must be removed. This can be carried out by means of solvents, such as, for example, acetone, or dilute aqueous alkaline solutions. The substrates are finely rinsed and dried.

This last step involves the risk, that the CNT comprising polymer layers are affected by solvents or the alkaline solutions or the layered material is delaminated.

In WO 2009/126891 A1 a dry etching of CNT comprising layers is disclosed, using a patterned masking layer and etching the CNT film in a plasma etch chamber using boron trichloride ($BCl_3$) and dichloride ($Cl_2$) and a substrate bias power.

Since these etching methods are time consuming and expensive, experiments were carried out to etch CNT comprising layers by exposure to applied pasty etching compositions at elevated temperatures or by exposure of thermal radiation or infrared radiation. Unexpectedly it was found by these experiments that CNT comprising layers can be etched selectively and uniform with high throughput by use of an alkaline based etching paste, such that this method can be applied for the treatment of CNT comprising layers for mass production of flexible photovoltaic devices and comparable products, like touch panels, displays (LCD) or solarcells.

Therefore, the object of the present invention is a method for selective etching of a polymer matrix comprising carbon nanotubes (CNTs) on a plastic substructure, which comprises the steps
a) printing an alkaline based etching paste onto the surface of a composite material comprising the polymer matrix with carbon nano tubes and the plastic substrate,
b) heating and
c) cleaning the substrate.

In step a) preferably an etching paste is printed onto the surface of a composite material, wherein the active etchant is selected from the group tetramethylammoniumhydroxid, tetrapropylammoniumhydrixid and tetraethylammonium hydrixid or from the group NaOH and KOH.

The applied paste composition may comprise a solvent, selected from the group water, mono- or polyhydric alcohols, such as glycerol, 1,2-propanediol, 1,4-butanediol, 1,3-butanediol, 1,5-pentanediol, 2-ethyl-1-hexenol, ethylene glycol, diethylene glycol and dipropylene glycol, and ethers thereof, such as ethylene glycol monobutyl ether, triethylene glycol monomethyl ether, diethylene glycol monobutyl ether and dipropylene glycol monomethyl ether, and esters, such as [2,2-butoxy(ethoxy)]ethyl acetate, esters of carbonic acid, such as propylene carbonate, ketones, such as acetophenone, methyl-2-hexanone, 2-octanone, 4-hydroxy-4-methyl-2-pentanone and 1-methyl-2-pyrrolidone, as such or in a mixture.

In a most preferred embodiment the etching paste comprises 1,4-butanediol as solvent. The solvent may be contained in an amount of from 10 to 90% by weight, preferably in an amount of from 15 to 85% by weight, based on the total amount of the medium.

In a particular embodiment the applied etching paste comprises organic or inorganic filler particles or mixtures thereof.

The applied etching paste preferably comprises inorganic or organic particles or mixtures thereof as filler and thickener. The polymer particles may be selected from the group of polystyrenes, polyacrylics, polyamides, polyimides, polymethacrylates, melamine, urethane, benzoguanine and phenolic resins, silicone resins, micronised cellulose and fluorinated polymers (PTFE, PVDF, inter alia) and micronised wax (micronised polyethylene wax). The inorganic particles may be selected from the group of aluminium oxides, calcium fluoride, boron oxide and sodium chloride.

Suitable etching pastes according to the present invention comprise the particulate organic or inorganic fillers and thickeners homogeneously distributed in amounts of from 0.5 to 25% by weight, based on the total amount of the etching medium.

According to the present invention the etching paste may applied to the surface by screen printing, inkjet printing, dispensing or micro-jetting.

When the etching paste is applied to the surface to be etched it is removed again after a reaction time of 10 s-15 min, preferably after 30 s to 7 min. In a most preferred embodiment of the inventive method the etching paste is removed after a reaction time of 5 minutes.

Usually the etching is carried out at elevated temperatures in the range from 20 to 170° C., preferably in the range from 120 to 150° C. and very particularly preferably from 120 to 140° C., but in any case the etching temperature has to be selected well below the melting points of the CNT-comprising polymer layer and that of the polymer substructure. Thus, in a preferred embodiment of the present invention the heating of the substrate lasts for 5 minutes at 130° C. When the etching is completed, the treated substrate is rinsed with DI water or with a suitable solvent, and the rinsed part is dried with dry air or nitrogen flow.

The new method disclosed herein is especially suitable for the etching of composite materials showing CNT (carbon nanotubes) comprising polymer layers on plastic substructures, especially on polyurethane, PEN or PET.

Said CNTs, which are embedded in the polymer layers, are single walled carbon nanotubes (SWNT), multi-walled carbon nanotubes (MWNT), fullerenes ($C_{60}$) or graphenes and the polymer layers preferably comprise transparent conductive polymers selected from the group poly(3-octylthiophene) (P3OT), poly(3-hexyl-thiophene) polymer (P3HT), poly(3,4-ethylene dioxythiophene), or other polythiophene derivatives and polyanilines, or are a combination of polymers like poly[2-methoxy-5-(3',7'-dimethyloctyloxy)1,4- phenylene vinylene] (MDMO-PPV)/1-(3-methoxycarbonyl)-propyl-1-phenyl)[6,6]$C_{61}$ (PCBM); poly(3-hexylthiophene) polymer (P3HT)/(PCBM) and poly(3,4-ethylene dioxythiophene)/poly(styrene sulfonate) (PEDOT/PSS).

This method enables to etch such layers with a resolution of the printed lines, points or structures of at least 500 μm, usually the resolution is substantially higher.

DETAILED DESCRIPTION

The disadvantages of the conventional etching methods as described are time-consuming, material-intensive and include expensive process steps. On top of this, these known etching methods are in some cases complex in view of the technical performance, safety, and are carried out batch-wise.

Therefore, the objective of the present invention is to provide a new etching composition, which is suitable to be employed in a simplified etching method for polymer-surfaces. It is also an objective of the present invention to provide an improved etching method for polymer-surfaces, which can be carried out with throughputs as high as possible, and which is significantly less expensive than conventional wet and dry etching methods in the liquid or gas phase.

Surprisingly, experiments have shown that difficulties due to the comprising CNT material may be overcome by the etching method according to the present invention and rough surface topographies of CNT materials as described above may be etched to smooth and even surfaces at the bottom of etched lines and structures, if depending on the nature of the layers, which have to be etched, the conditions of etching are suitable. If desired, only CNTs comprising polymer layers of the treated composite material may be patterned by the etching method according to the present invention. But if also the plastic substructure has to be by an etching step, the conditions of etching and the applied etching composition may be changed. This means, that rough topographies of conductive polymer layers due to comprising CNTs as well as plastic layers consisting of polyurethane, PET or PEN may be etched using alkaline etching compositions disclosed here.

In addition to this, it was found, that advantageously according to the present invention the suitable etching pastes can be applied with high resolution and precision in a single process step onto the substrate surface at areas to be etched. There is no need for a previous protection with a photoresist layer on areas, which have to stay unchanged.

Thus, a method with a high degree of automation and high throughput is provided, which is suitable for the transfer of the etching paste to the substrate surface to be etched using a printing technology. In particular, printing technologies like screen printing, silk-screen printing, pad printing, stamp printing, mikrojet-printing and ink-jet printing methods are printing methods which are known to the person skilled in the art, but dispensing and manual application are possible as well.

In particular the present invention refers to a method of selectively etching a polymer matrix comprising CNTs (carbon nano tubes) on a plastic substructure, preferably on a substructure consisting of polyethylene terephthalate (PET), polyethylene naphthalate (PEN) or polyurethane. The etching paste is printed on the plastic substrate. At once the polymer is heated to a temperature of about 20° C. to 170° C., preferably to about 120 to 140° C. The temperature is kept for about 10 s to 15 minutes, preferably for 30 s to 7 minutes. In a most preferred embodiment the elevated temperature is kept for 5 minutes at 130° C. Then the etching step is stopped by cleaning with a suitable solvent. Preferably the surface is rinsed with DI water. But in detail the term of heating, the kept temperature and the cleaning has to be adapted to the special nature of the polymer matrix comprising CNTs and to that of the substructure underneath.

As such the polymer matrix and the comprising CNTs are etched by use of a paste comprising a solvent, an alkaline etchant, like an alkali hydroxide, selected from KOH and NaOH or selected from tetramethylammoniumhydroxid, tetrapropylammoniumhydrixid and tetraethylammonium hydrixid, and further comprising at least a thickener and/or organic filler. The thickener and organic filler may be the same or different and may be inorganic or organic polymer particles, or mixtures thereof. Besides the composition may also comprise at least a thickener and organic or inorganic particles or mixtures thereof.

In addition to these main ingredients the etching composition may comprise further additives, such as antifoams, thixotropic agents, flow-control agents, deaerators or adhesion promoters for an improved manageability and processability.

The etching paste composition according to the invention may comprise a solvent, selected from the group water, mono- or polyhydric alcohols, such as glycerol, 1,2-propanediol, 1,4-butanediol, 1,3-butanediol, 1,5-pentanediol, 2-ethyl-1-hexenol, ethylene glycol, diethylene glycol and dipropylene glycol, and ethers thereof, such as ethylene glycol monobutyl ether, triethylene glycol monomethyl ether, diethylene glycol monobutyl ether and dipropylene glycol monomethyl ether, and esters, such as [2,2-butoxy(ethoxy)] ethyl acetate, esters of carbonic acid, such as propylene carbonate, ketones, such as acetophenone, methyl-2-hexanone, 2-octanone, 4-hydroxy-4-methyl-2-pentanone and 1-methyl-2-pyrrolidone, as such or in a mixture. In a most preferred embodiment the etching paste comprises 1,4-butandiol as solvent. The solvent may be contained in an amount of from 10 to 90% by weight, preferably in an amount of from 15 to 85% by weight, based on the total amount of the medium.

If etching compositions according to the invention comprise thickeners, these may be selected from the group of
cellulose/cellulose derivatives and/or
starch/starch derivatives and/or
xanthan and/or
polyvinylpyrrolidone
polymers based on acrylates of functionalised vinyl units.
Thickeners like this are commercially available.

The prepared etching composition shows at 20° C. a viscosity in the range from 6 to 35 Pa·s at a shear rate of 25 s$^{-1}$, preferably in the range from 10 to 25 Pa·s at a shear rate of 25 s$^{-1}$ and very particularly preferably from 15 to 20 Pa·s at a shear rate of 25 s$^{-1}$.

Additives having properties which are advantageous for the desired purpose are
antifoams, such as, for example, the one available under the trade name TECO® Foamex N,
thixotropic agents, such as BYK® 410, Borchigel® Thixo2,
flow-control agents, such as TECO® Glide ZG 400,
deaeration agents, such as TECO® Airex 985, and
adhesion promoters, such as Bayowet® FT 929.

These may have a positive effect on the printability of the printing paste. The proportion of the additives is in the range from 0 to 5% by weight, based on the total weight of the etching paste.

The method and the paste composition according to the present invention are particularly useful for dispensing or printing of an especially suitable etching composition and selectively etching of small structures on plastic substrates. Unexpected for a skilled worker this method is suitable for the etching of polymer layers comprising CNTs and for the etching of the supporting plastic substructure if desired.

According to the present invention CNTs (carbon nanotubes) in conductive polymer layers include so-called single walled carbon nanotubes (SWNT), multi-walled carbon nanotubes (MWNT) and fullerenes ($C_{60}$) but also graphenes and all forms of appearances of carbon which may exhibit active components in transparent layers suitable for transforming solar energy into electricity. These forms also include suitable forms of appearances of carbon, which may only be obtained by special treatments and which may be functionalized to affect their electron acceptance. In the following the different appearances are called CNTs.

These CNTs are combined with suitable transparent polymers to form uniform conductive continuous films, which are optically homogeneous and of controllable thickness, which is thin enough to be still transparent over technologically relevant regions of the electromagnetic spectrum of solar light. Suitable polymers for the preparation of these films include but are not limited to polymers selected from the group poly(3-octylthiophene) (P3OT), poly(3-hexyl-thiophene) polymer (P3HT), poly(3,4-ethylene dioxythiophene), or other polythiophene derivatives and polyanilines and other electron donor polymers
or combinations of polymers like poly[2-methoxy-5-(3',7'-dimethyloctyloxy)1,4-phenylene vinylene] (MDMO-PPV)/1-(3-methoxycarbonyl)-propyl-1-phenyl)[6,6]$C_{61}$ (PCBM); poly(3-hexyl-thiophene) polymer (P3HT)/(PCBM); poly(3,4-ethylene dioxythiophene)/poly(styrene sulfonate) (PEDOT/PSS).

These films, prepared from CNTs and said transparent polymers are suitable to substitute ITO layers in flexible photovoltaic devices [M. W. Rowell. et al., applied Physics Letters 88, 233506 (2006)]

The edge sharpness of the etched patterns and the depth of etching in the polymer-based substrates and their layers of variable thickness can be adjusted by variation of the following parameters:

Concentration and composition of the etching components
Concentration and composition of the solvents
Concentration and composition of the thickener systems
Concentration and composition of the filler content
Concentration and composition of any additives added, such as antifoams, thixotropic agents, flow-control agents, deaeration agents and adhesion promoters
Viscosity of the printable etching paste as described in accordance with the invention
Etching duration with or without input of energy into the etching paste and/or the to be etched substrate
Etching temperature The etching duration can last for a few seconds or for several minutes. This depends on the application, desired etching depth and/or edge sharpness of the etch structures. In general, the etching time is in the range of between a few seconds and 10 minutes, but if necessary the time may be extended.

According to a preferred embodiment of the present invention the printable etching composition is an alkaline etching paste, which is prepared by simply mixing the ingredients, as there are the etchant, solvent, thickener and filler content.

The surface to be etched here can be a surface or part-surface of transparent, conductive polymer layer comprising CNTs on a support material consisting of flexible plastic. The transparent, conductive polymer may be a polymer selected from the group poly(3-octylthiophene) (P3OT), poly(3-hexyl-thiophene) polymer (P3HT), poly(3,4-ethylene dioxythiophene), or other polythiophene derivatives and polyanilines. The transparent, conductive polymer layer may also comprise a combination of polymers like poly[2-methoxy-5-(3',7'-dimethyloctyloxy)1,4-phenylene vinylene] (MDMO-PPV)/1-(3-methoxycarbonyl)-propyl-1-phenyl)[6,6]$C_{61}$ (PCBM); poly(3-hexyl-thiophene) polymer (P3HT)/(PCBM); poly(3,4-ethylene dioxythiophene)/poly(styrene sulfonate) (PEDOT/PSS), wherein CNTs are embedded.

A suitable process having a high degree of automation and having high throughput utilises printing technology for the transfer of the etching paste to the substrate surface to be etched. In particular, the screen, pad, stamp, ink-jet printing processes are printing processes that are known to the person skilled in the art. Manual application is likewise possible.

Depending on the screen, plate or stamp design or cartridge addressing, it is possible to apply the etching pastes having non-Newtonian flow behaviour which are described in accordance with the invention over the entire area or selectively in accordance with the etch structure pattern only in the areas where etching is desired. All masking and lithography steps which are otherwise necessary are thus superfluous. The etching operation can be carried out with or without energy input, for example in the form of heat radiation (using IR lamps).

The actual etching process is subsequently completed by washing the surfaces with water and/or a suitable solvent. More precisely, the printable, polymer particle-containing etching pastes having non-Newtonian flow behaviour are rinsed off the etched areas using a suitable solvent after etching is complete.

Use of the etching pastes according to the invention thus enables long runs to be etched inexpensively on an industrial scale in a suitable, automated process.

In a preferred embodiment, the etching paste according to the invention has a viscosity in the range from 10 to 500 Pa·s, preferably from 50 to 200 Pa·s. The viscosity is the material-dependent component of the frictional resistance which counters movement when adjacent liquid layers are displaced. According to Newton, the shear resistance in a liquid layer between two sliding surfaces arranged parallel and moved relative to one another is proportional to the velocity or shear gradient G. The proportionality factor is a material constant which is known as the dynamic viscosity and has the dimension m Pa·s. In Newtonian liquids, the proportionality factor is pressure- and temperature-dependent. The degree of dependence here is determined by the material composition. Liquids or substances having an inhomogeneous composition have non-Newtonian properties. The viscosity of these substances is additionally dependent on the shear gradient.

For the etching of fine structures, having line widths of <200 μm, by printed etching media, it has been found to be particularly advantageous to thicken etching media completely or partially using finely divided particulate systems. Particularly suitable for this purpose are polymer particles which interact with the other components of the composition and form a network by means of chemical bonds or a purely physical interaction at the molecular level. The relative particle diameters of these systems can be in the range from 10 nm to 30 μm. Corresponding polymer particles having a relative particle diameter in the range from 1 to 10 μm have proved particularly advantageous. Particles which are particularly suitable for the purpose according to the invention can consist of the following materials:

polystyrene
polyacrylic
polyamide
polyethylene
ethylene-vinyl acetate copolymer
ethylene-acrylic acid-acrylate terpolymer
ethylene-acrylate-maleic anhydride terpolymer
polypropylene polyimide
polymethacrylate
melamine, urethane, benzoguanine, phenolic resin
silicone resin
fluorinated polymers (PTFE, PVDF), and
micronised waxes The use of a very finely divided polyethylene powder, which is, for example, currently marketed by DuPont PolymerPowders Switzerland under the trade name COATHYLENE HX® 1681, having relative particle **diameters $d_{50}$ value of 10 μm has proven particularly suitable in the experiments.

These particulate thickeners can be added to the etching medium in amounts of from 0.5 to 50% by weight, advantageously in the range from 0.5 to 40% by weight, in particular from 0.5 to 25% by weight.

Particularly appropriate are particulate polymeric thickeners based on
polystyrene
polyacrylic
polyamide
polyimide
polymethacrylate
melamine, urethane, benzoguanine, phenolic resin
and
silicone resin.

In stead of polymer particles the etching composition may comprise inorganic particles in the same amount or polymer particles may be replaced partially. Suitable inorganic particles are aluminium oxides, calcium fluoride, boron oxide and sodium chloride. Preferably these inorganic particles show the same mean diameters in the range from 10 nm to 30 μm, most preferably in the range from 1 to 10 μm.

Experiments have shown, that etching pastes according to the present invention are excellently adapted to be employed in a simplified etching method for polymer-surfaces:

Particulate thickening results in improved resilience of the etching medium. The particles form a skeleton-structure in the etching medium. Similar structures are known to the person skilled in the art from highly dispersed silicic acid (for example Aerosil®). In particular in screen printing of the etching pastes, a broadening of the printed structures due to flow can be substantially prevented or at least greatly restricted by the present invention. The printed, and thus paste-covered area therefore corresponds substantially to the area specified in the screen layout.

The thickening associated with the addition of polymer particles according to the invention results in a low binding capacity of the etching paste. Given a specific choice of the particles added, an unexpected etching rate and thus a considerably etching depth are achieved for the amount of added etching component.

Significant advantages in the present compositions arise, in particular, through an outstanding screen-printing behaviour, enabling continuous printing of surfaces to be treated without interruptions. The use of the etching pastes according to the invention enables surprisingly fine etching structures since the pastes have high viscosities on addition of the of thickener in the presence of polymer particles. This enables the pastes to be applied in printing with a high paste layer and consequently for the layers to be etched deep, because the print height achieved under the printing conditions causes a delayed drying of the printed etching species. This enables the etching species to act on the substrate for longer. This is particularly important in the case of etching under elevated temperatures. In addition, the material remaining after the etching process can be removed easily in the final cleaning process and the good rinsing behaviour after etching leads to a short subsequent cleaning.

Surprisingly, experiments have shown that the addition of corresponding fine polymer particles also have an advantageous effect in processes for the selective etching of surfaces of transparent conductive polymer layers comprising CNTs for the production of flexible photovoltaic devices. Immediately after application to the surfaces to be etched, the treated composite material is heated over the entire surface to temperatures in the range from 100 to 170° C. for a period of time from several seconds to 15 minutes, in particular to temperatures in the range from 120 to 150° C., for 30 s to 7 minutes. The selected temperature is of course set in such a way that changes in the particles present in the paste do not give rise to any disadvantages.

It has been found that an alkaline etchant, like an alkali hydroxide, selected from KOH and NaOH or selected from tetramethylammoniumhydroxid, tetrapropylammoniumhydrixid and tetraethylammonium hydrixid and other compounds which lead to a high pH value of more than 12 in aqueous solution are capable of completely etching away CNT comprising conductive, transparent polymer layers having a layer thickness of several hundred nm within a few seconds to minutes at temperatures in the range between 100° C. to 170° C. At 120° C., the etching time is about 10 to 15 minutes.

For the preparation of the particle-containing etching composition according to the invention, the solvents, etching components, thickeners, particles and additives are mixed successively with one another and stirred for a sufficient time until a viscous paste has formed. The stirring can be carried out with warming to a suitable temperature. The components are usually stirred with one another at room temperature.

Preferred uses of the printable etching pastes according to the invention arise for the described processes for the structuring of CNT comprising conductive, transparent polymer layers applied to a flexible support material, for the production of flexible photovoltaic devices, preferably solar cells.

For application of the pastes to the areas to be treated, the etching pastes can be printed through a fine-mesh screen which contains the print template (or etched metal screen). On use of the etching pastes according to the invention, the applied etching pastes are washed off with a suitable solvent or solvent mixture after a certain reaction time. The etching action is terminated by the washing-off.

Particularly suitable printing methods are essentially screen printing with screen separation or stencil printing without separation. In screen printing, the separation a of a screen is usually several hundred μm with a tilt angle α between the edge of the squeegee, which pushes the etching printing paste over the screen, and the screen. The screen is held by a screen frame, while the squeegee is passed over the screen at a squeegee velocity v and a squeegee pressure P. In the process, the etching paste is pushed over the screen. During this operation, the screen comes into contact with the substrate in the form of a line over the squeegee width. The contact between screen and substrate transfers the vast majority of the screen printing paste located in the free screen meshes onto the substrate. In the areas covered by the screen meshes, no screen printing paste is transferred onto the substrate. This enables screen printing paste to be transferred in a targeted manner to certain areas of the substrate.

After the end of the movement E, the squeegee is raised off the screen. The screen is tensioned uniformly using a screen stretcher with hydraulic/-pneumatic tension and clamping device. The screen tension is monitored by defined sag of the screen in a certain area at a certain weight using a dial gauge. With specific pneumatic/hydraulic printing machines, the squeegee pressure (P), the printing velocity (V), the off-contact distance (A) and the squeegee path (horizontal and vertical, squeegee angle) can be set with various degrees of automation of the working steps for trial and production runs.

Printing screens used here usually consist of plastic or steel-wire cloth. It is possible for the person skilled in the art to select cloths having different wire diameters and mesh widths, depending on the desired layer thickness and line width. These cloths are structured directly or indirectly using photosensitive materials (emulsion layer). For the printing of extremely fine lines and in the case of requisite high precision of successive prints, it may be advantageous to use metal stencils, which are likewise provided directly or indirectly with a hole structure or line structure. If necessary, flexible printing devices may be used for the application of the etching composition.

In order to carry out the etching, an etching paste, as described, for example, in Example 1, is prepared. Using an etching paste of this type, a CNT substrate having a thickness of approx. 300 nm can be removed within 10 minutes at 120° C. after screen printing. The etching is subsequently terminated by dipping the devise into water and then rinsing with the aid of a fine water spray.

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

The temperatures given in the examples are always in ° C. It furthermore goes without saying that the added amounts of the components in the composition always add up to a total of 100% both in the description and in the examples.

The present description enables the person skilled in the art to use the invention comprehensively. If anything is unclear, it goes without saying that the cited publications and patent literature should be used. Correspondingly, these documents are regarded as part of the disclosure content of the present description and the disclosure of cited literature, patent applications and patents is hereby incorporated by reference in its entirety for all purposes.

EXAMPLES

The alkaline etchant, preferably tetramethylammoniumhydroxid, is mixed with the solvent in a beaker with a magnetic stirrer, the thickener is slowly added while stirring the mixture, afterwards the filler quantity required is added while stirring the mixture.

Example 1

Best Mode 5 parts Tetramethylammoniumhydroxid
1 part 1,4-Butandiol
1 part Carbopol 676
2 parts Ceridust 3719
20 parts H2O The prepared etching composition is screen printed onto the surface of a CNT comprising polymer layer, which is supported on a flexible PET substructure. The composite material is heated for 10 minutes to a temperature of 120° C.

Figure 1:
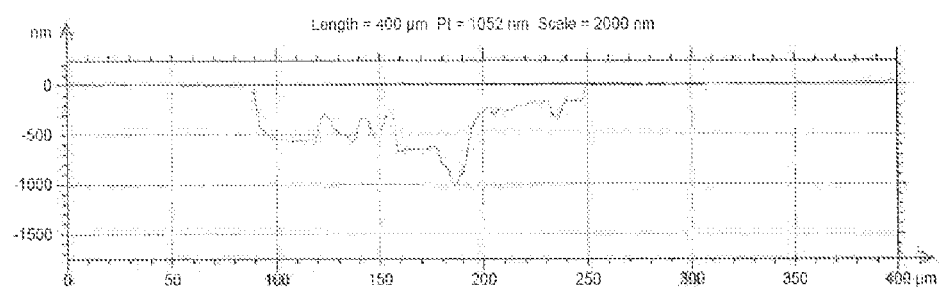
FIG. 1 shows shows a measured etching profile achieved with a composition according to example 1.

FIG. 1 shows the measured etching profile achieved with a composition according to example 1 and where a CNT comprising polymer layer is etched at 120° C. for 10 minutes.

Figure 2:
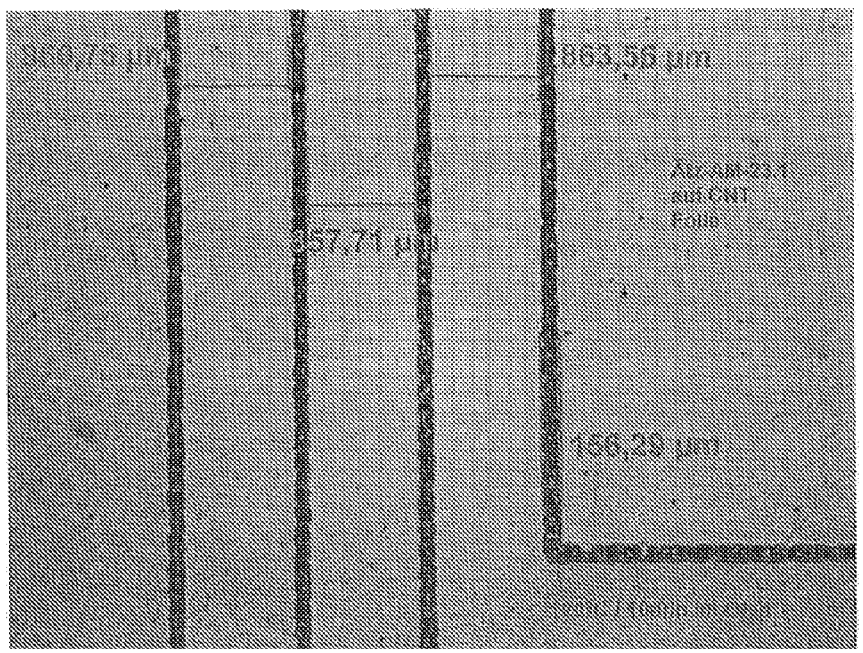
FIG. 2 shows a micrograph of the etching result of example 1

FIG. 2 shows a micrograph of the etching result of example 1, where a CNT comprising polymer layer is etched at 120° C. for 10 min with a composition according to example 1. The paste is screen printed.

These etching results illustrate, that for good results the concentration of the comprising etchant, the amount of the applied etching paste, etching time and temperature have to be optimized for different layers and layer-thicknesses.

Example 2

3 parts Tetramethylammoniumhydroxid
2 parts ethanol
1 part Carbopol EZ 2
1 part Vestosint PA 2070

Example 3

6 parts Tetramethylammoniumhydroxid
2 parts methanol
1 part Carbopol EZ 2
1 part Vestosint PA 2070

The etching paste is printed onto the substrate by screen printing. Other ways of printing the etching paste with the above described printing methods are possible as described above.

Example 4

40.0 g KOH
59.0 g DI Water
1.5 g Ethylenglycolmonobutylether
4.0 g Carbomer

The components are solved and mixed and the thickener is added while stirring.

The invention claimed is:

1. A method for selective etching of a polymer matrix comprising carbon nanotubes (CNTs) on a plastic substructure, said method comprising:
   a) printing an alkaline based etching paste onto the surface of a composite material comprising the polymer matrix with carbon nano tubes and the plastic substructure,
   b) heating, and
   c) cleaning the plastic substructure.

2. The method according to claim 1, wherein said etching paste comprises an etchant which is selected from tetramethylammonium hydroxide, tetrapropylammonium hydroxide, tetraethylammonium hydroxide, NaOH, and KOH.

3. The method of claim 1, wherein said etching paste comprises a solvent selected from water, mono- or polyhydric alcohols, glycerol, 1,2-propanediol, 1,4-butanediol, 1,3-butanediol, 1,5-pentanediol, 2-ethyl-1-hexenol, ethylene glycol, diethylene glycol, dipropylene glycol, ethers of mono- or polyhydric alcohols, ethylene glycol monobutyl ether, triethylene glycol monomethyl ether, diethylene glycol monobutyl ether, dipropylene glycol monomethyl ether, esters of mono- or polyhydric alcohols, [2,2-butoxy(ethoxy)]ethyl acetate, esters of carbonic acid, propylene carbonate, ketones, acetophenone, methyl-2-hexanone, 2-octanone, 4-hydroxy-4-methyl-2-pentanone and 1-methyl-2-pyrrolidone, and mixtures thereof, in an amount of from 10 to 90% by weight, based on the total amount of the etching paste.

4. The method of claim 1, wherein said etching paste comprises 1,4-butandiol as a solvent.

5. The method of claim 1, wherein said etching paste comprises organic or inorganic filler particles or mixtures thereof in amounts of from 0.5 to 25% by weight, based on the total amount of the etching paste.

6. The method of claim 1, wherein said etching paste comprises organic polymer particles as filler and thickner, wherein said organic polymer particles are selected from polystyrenes, polyacrylics, polyamides, polyimides, polymethacrylates, melamine, urethane, benzoguanine and phenolic resins, silicone resins, micronized cellulose, fluorinated polymers, PTFE, PVDF, and micronized wax.

7. The method of claim 1, wherein said etching paste comprises inorganic particles as filler and thickener, wherein said inorganic particles are selected from aluminium oxides, calcium fluoride, boron oxide and sodium chloride.

8. The method of claim 1, wherein the etching paste is applied onto the surface of said composite material by screen printing, inkjet printing, dispensing, or micro-jetting.

9. The method according to claim 1, wherein the heating of the substrate is conducted for 10 s-15 min at a temperature in the range of 20 to 170° C.

10. The method according to claim 9, wherein cleaning of said substrate is performed by rinsing with deionized water or with a solvent; and the rinsed part is dried with dry air or nitrogen flow.

11. The method according to claim 1, wherein the heating of the substrate is conducted for 5 minutes at 130° C.

12. The method according to claim 1, wherein said plastic is polyurethane, polyethylene naphthalate or polyethylene terephatalate.

13. The method according to claim 1, wherein the carbon nanotubes are embedded in conductive polymer layers, and said carbon nanotubes are single walled carbon nanotubes, multi-walled carbon nanotubes, fullerenes ($C_{60}$) or graphenes.

14. The method according to claim 1, wherein the polymer is a conductive polymer selected from poly(3-octylthiophene), poly(3-hexyl-thiophene) polymer, poly(3,4-ethylene dioxythiophene), other polythiophene derivatives, polyanilines, or is a combination of polymers selected from poly[2-methoxy-5-(3',7'-dimethyloctyloxy)1,4-phenylene vinylene] /1-(3-methoxycarbonyl)-propyl-1-phenyl)[6,6]$C_{61}$; poly(3-hexyl-thiophene) polymer /1-(3-methoxycarbonyl)-propyl-1-phenyl)[6,6]$C_{61}$; and poly(3,4-ethylene dioxythiophene)/poly(styrene sulfonate).

15. The method according to claim 1, wherein the resolution of the resultant printed lines, dots or structures is at least 500 μm.

\* \* \* \* \*